(12) United States Patent
Iijima

(10) Patent No.: US 8,546,174 B2
(45) Date of Patent: Oct. 1, 2013

(54) METHOD FOR MANUFACTURING SEMICONDUCTOR DEVICE

(75) Inventor: Tadashi Iijima, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/362,597

(22) Filed: Jan. 31, 2012

(65) Prior Publication Data

US 2012/0244657 A1 Sep. 27, 2012

(30) Foreign Application Priority Data

Mar. 25, 2011 (JP) ................. 2011-068931

(51) Int. Cl.
*H01L 21/00* (2006.01)
(52) U.S. Cl.
USPC ........... 438/70; 438/60; 438/73; 438/78; 438/79; 257/290; 257/291; 257/292
(58) Field of Classification Search
None
See application file for complete search history.

(56) References Cited

U.S. PATENT DOCUMENTS

| | | | |
|---|---|---|---|
| 2004/0082177 A1* | 4/2004 | Lee | 438/690 |
| 2008/0197436 A1* | 8/2008 | Uya | 257/432 |

FOREIGN PATENT DOCUMENTS

| | | |
|---|---|---|
| JP | 2008-103664 | 5/2008 |
| JP | 2010-3928 | 1/2010 |
| JP | 2010-50249 | 3/2010 |
| JP | 2010-171036 | 8/2010 |
| JP | 2010-182944 | 8/2010 |
| JP | 2010-206174 | 9/2010 |

OTHER PUBLICATIONS

Office Action mailed Jul. 2, 2013, in Japanese Patent Application No. 2011-068931 filed Mar. 25, 2011 (with English Translation).

* cited by examiner

*Primary Examiner* — Kyoung Lee
(74) *Attorney, Agent, or Firm* — Oblon, Spivak, McClelland, Maier & Neustadt, L.L.P.

(57) ABSTRACT

In a method for manufacturing a semiconductor device according to an embodiment, an epitaxial semiconductor layer is epitaxially grown on a semiconductor substrate, a photoelectric converting portion is formed on the epitaxial semiconductor layer, a wiring layer is formed on the epitaxial semiconductor layer after forming the photoelectric converting portion, a support substrate is bonded onto the wiring layer, and the semiconductor substrate is etched from an opposite surface side to a side for the bonding after the bonding. In the method for manufacturing a semiconductor device, an amorphous Si layer is formed on the opposite surface side of the epitaxial semiconductor layer after the etching and an antireflection film and a color filter are formed on the amorphous Si layer in sequence.

13 Claims, 22 Drawing Sheets

US 8,546,174 B2

METHOD FOR MANUFACTURING SEMICONDUCTOR DEVICE

CROSS-REFERENCE TO RELATED APPLICATIONS

This application is based upon and claims the benefit of priority from Japanese Patent Application No. 2011-68931, filed on Mar. 25, 2011; the entire contents of which are incorporated herein by reference.

FIELD

An embodiment described herein relates generally to a method for manufacturing a semiconductor device.

BACKGROUND

In recent years, attention is paid to a market for a small-sized camera module in an application to a digital still camera or a portable telephone having a camera. An image pickup device such as a CCD or a CMOS image sensor which is to be used in a camera module has a sensor performance enhanced with progress in fineness of the semiconductor technology. As one of techniques for enhancing the sensor performance, there is proposed a backside-illumination type CMOS image sensor which improves sensitivity or advanced shading.

In the backside-illumination type CMOS image sensor, it is necessary to suppress an interface state of a back face side. Conventionally, an improvement is carried out by a method for forming an insulating film having a negative electric charge to suppress the generation of a recombination current due to a depletion at a surface side or the like. However, there is a problem in that a characteristic is deteriorated due to an operating time by an effect for decreasing the hold of the electric charge of the insulating film having the negative electric charge depending on a time.

DETAILED DESCRIPTION

In a method for manufacturing a semiconductor device according to an embodiment, an epitaxial semiconductor layer is epitaxially grown on a semiconductor substrate, a photoelectric converting portion is formed on the epitaxial semiconductor layer, a wiring layer is formed on the epitaxial semiconductor layer after the formation of the photoelectric converting portion, a support substrate is bonded onto the wiring layer, and the semiconductor substrate is etched from an opposite surface side to a side for the bonding after the bonding. In the method for manufacturing a semiconductor device, an amorphous Si layer is formed on the opposite surface side of the epitaxial semiconductor layer after the etching and an antireflection film and a color filter are formed on the amorphous Si layer in sequence.

With reference to the accompanying drawings, a method for manufacturing a semiconductor device according to embodiments will be described below in detail. The present invention is not restricted to the embodiments.
(First Embodiment)
A method for manufacturing a semiconductor device according to a first embodiment will be described with reference to FIGS. 1A to 6 to be sectional views illustrating respective steps.

Figure 1A:
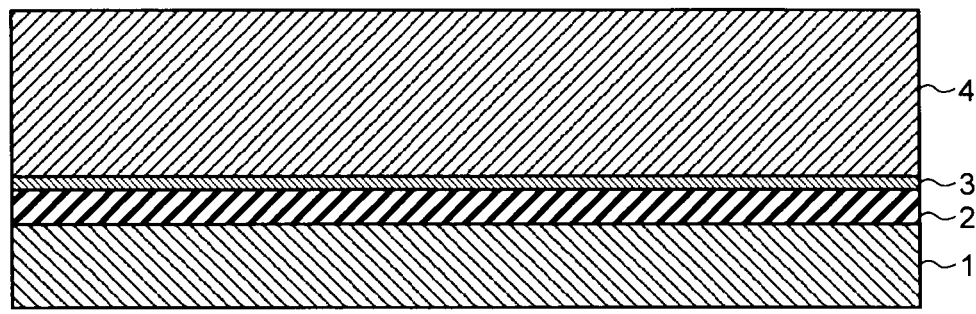
FIGS. 1A to 1D are sectional views illustrating each step in a method for manufacturing a semiconductor device according to a first embodiment.

In FIG. 1A, a thin semiconductor layer 3 is provided on a semiconductor substrate 1 through a BOX layer 2. An SOI substrate can be used for a substrate having the thin semiconductor layer 3 provided on the semiconductor substrate 1 through the BOX layer 2. For example, Si can be used for a material of the semiconductor substrate 1 and a silicon oxide film can be used for a material of the BOX layer 2. First of all, an N-type semiconductor layer 4 is epitaxially grown on the thin semiconductor layer 3 by setting the thin semiconductor layer 3 to be a starting point of the growth. Although a P-type semiconductor layer may be epitaxially grown on the thin semiconductor layer 3, description will be given to the case in which the N-type semiconductor layer 4 is formed as an example.

Figure 1B:
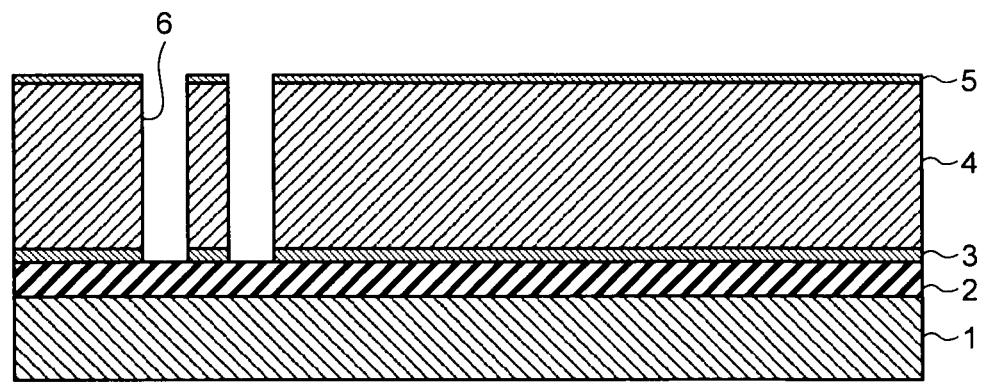

As illustrated in FIG. 1B, next, a stopper layer 5 is provided on a whole surface of the N-type semiconductor layer 4 by a method such as CVD. By using photolithography and dry etching, then, a through hole 6 is formed on the stopper layer 5 and the N-type semiconductor layer 4. For example, a silicon nitride film can be used for a material of the stopper layer 5.

Figure 1C:
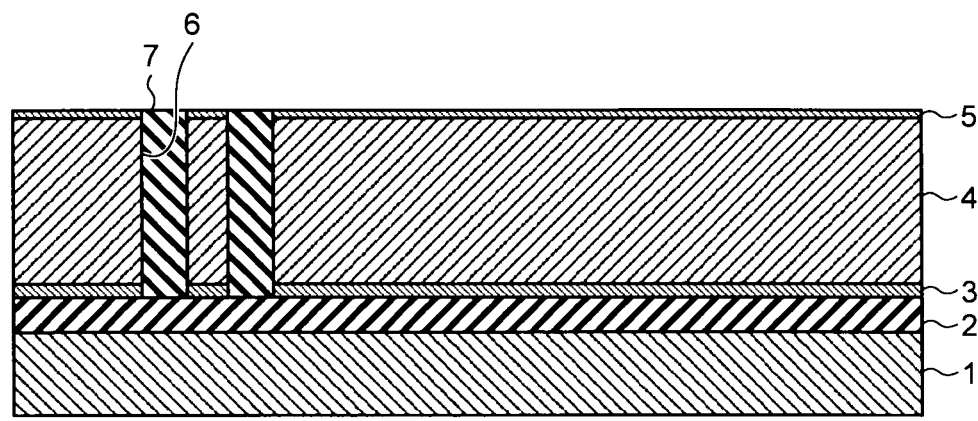

As illustrated in FIG. 1C, subsequently, a through hole insulating layer 7 is provided on a whole surface of the stopper layer 5 to fill in the through hole 6 by a method such as CVD. Then, the through hole insulating layer 7 is thinned by using a method such as CMP to remove the through hole insulating layer 7 provided on the stopper layer 5. A silicon oxide film can be used for a material of the through hole insulating layer 7.

Figure 1D:
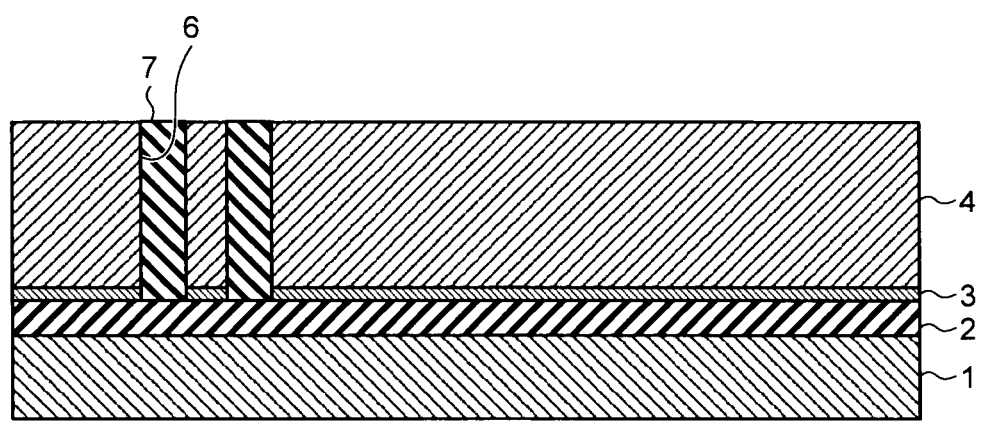

As illustrated in FIG. 1D, thereafter, the stopper layer 5 is subjected to etching so that the stopper layer 5 is removed from the N-type semiconductor layer 4. It is preferable that wet etching should be used to prevent the surface of the N-type semiconductor layer 4 from being damaged when removing the stopper layer 5 from the N-type semiconductor layer 4.

Figure 2A:
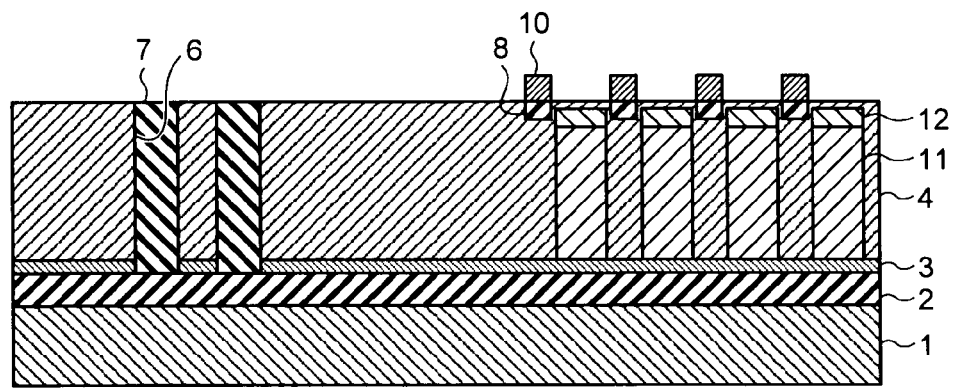
FIGS. 2A to 2D are sectional views illustrating each step in the method for manufacturing a semiconductor device according to the first embodiment.

As illustrated in FIG. 2A, next, an element isolating layer 8 disposed between pixels is embedded in the surface side of the N-type semiconductor layer 4 and a gate electrode 10 is then formed on the N-type semiconductor layer 4 for every pixel. For example, a silicon oxide film can be used for a material of the element isolating layer 8 and a polycrystalline silicon film can be used for a material of the gate electrode 10.

Thereafter, an impurity ion such as P or As is implanted into the N-type semiconductor layer 4 to form an N-type impurity introduced layer 11 in a deep position of the N-type semiconductor layer 4. Moreover, an impurity ion such as B is implanted into the N-type semiconductor layer 4 to form a P-type impurity introduced layer 12 in a shallow position of the N-type semiconductor layer 4. The P-type impurity introduced layer 12 is provided on the N-type impurity introduced layer 11 so that a photodiode is formed as a photoelectric converting portion for every pixel.

Before the gate electrode 10 is formed on the N-type semiconductor layer 4, the N-type impurity introduced layer 11 and the P-type impurity introduced layer 12 may be formed on the N-type semiconductor layer 4.

Figure 2B:
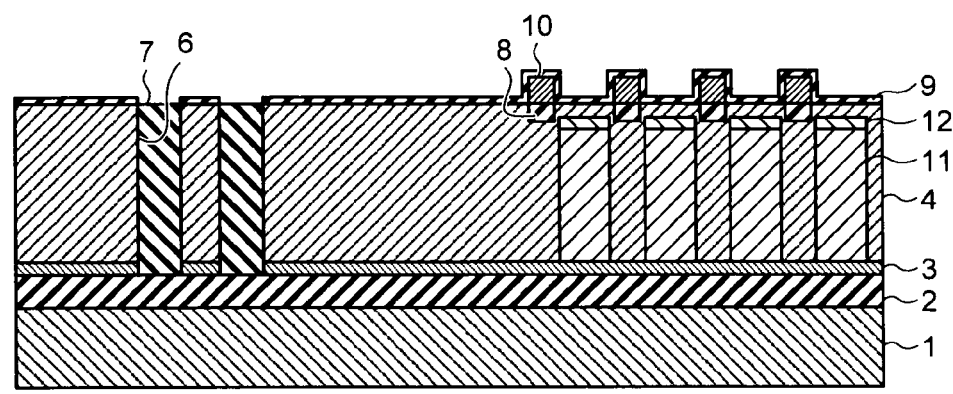

As illustrated in FIG. 2B, subsequently, an insulating film 9 is formed on the surface of the N-type semiconductor layer 4 by thermal oxidation or CVD. A thickness of the insulating film 9 can be set to be approximately 5 to 6 nm. An impurity to be used for an ion implantation at this time can be Si, Ge, C, B or In, for example. By forming the silicon oxide film 9 before implanting the ion into the surface layers of the N-type semiconductor layer 4 and the N-type impurity introduced layer 11, moreover, it is possible to uniformly carry out the ion implantation.

Figure 2C:
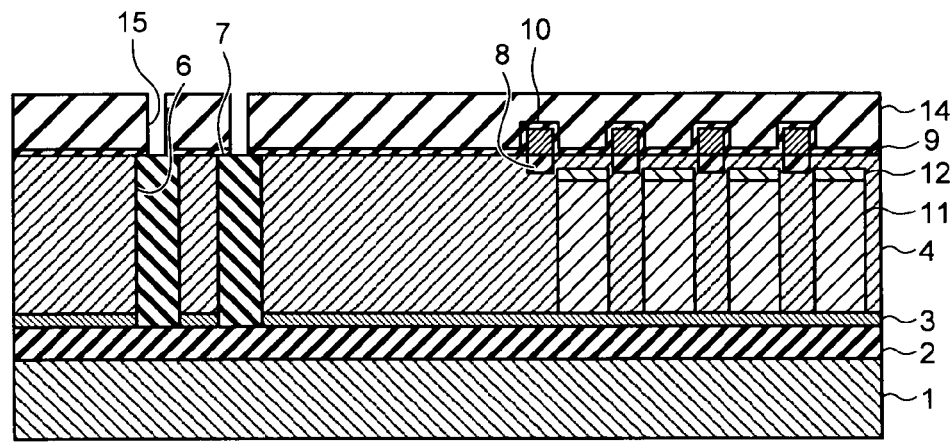

As illustrated in FIG. 2C, next, an interlayer insulating layer 14 is provided on a whole surface of the N-type semiconductor layer 4 by a method such as CVD. By using photolithography and dry etching, then, an opening portion 15 for exposing the through hole insulating layer 7 is formed on the insulating film 9 and the interlayer insulating layer 14. For example, a silicon oxide film can be used for a material of the interlayer insulating layer 14. In the case in which the insulating film 9 and the interlayer insulating layer 14 are formed by the same material, moreover, the insulating film 9 and the interlayer insulating layer 14 can be formed integrally.

Figure 2D:
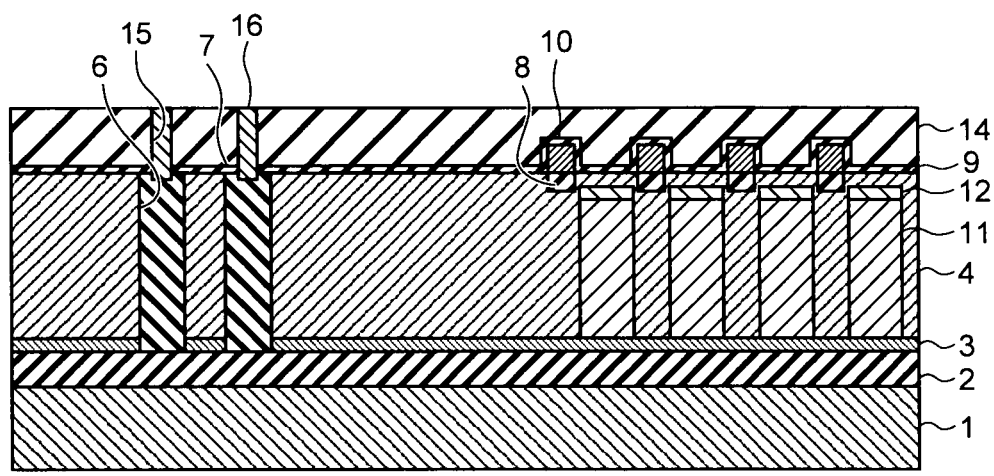

As illustrated in FIG. 2D, thereafter, an embedded electrode 16 is formed on the whole surface of the interlayer insulating layer 14 to fill in the opening portion 15 by a method such as CVD. Subsequently, the embedded electrode 16 is thinned through a method such as CMP and the embedded electrode 16 provided on the interlayer insulating layer 14 is thus removed. For example, it is possible to use W, Al, Cu or the like for a material of the embedded electrode 16.

Figure 3A:
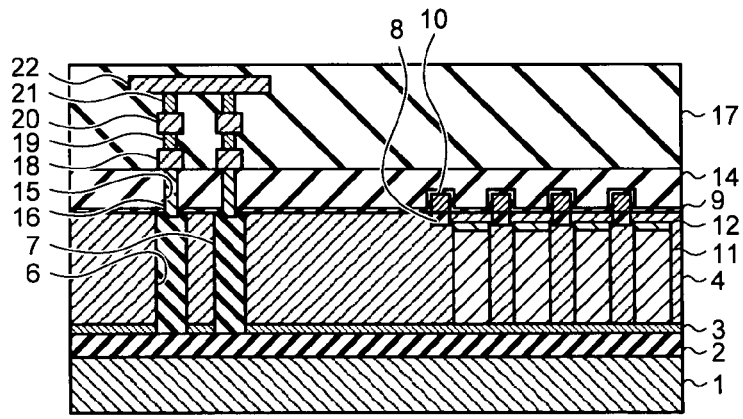
FIGS. 3A to 3D are sectional views illustrating each step in the method for manufacturing a semiconductor device according to the first embodiment.

As illustrated in FIG. 3A, next, an interlayer insulating layer 17 is provided on a whole surface of the interlayer insulating layer 14 by a method such as CVD, and wirings 18, 20 and 22 and embedded electrodes 19 and 21 which are embedded in the interlayer insulating layer 17 are formed. For example, a silicon oxide film can be used for a material of the interlayer insulating layer 14, Al or Cu can be used for materials of the wirings 18, 20 and 22, and W, Al, Cu or the like can be used for materials of the embedded electrodes 19 and 21.

Figure 3B:
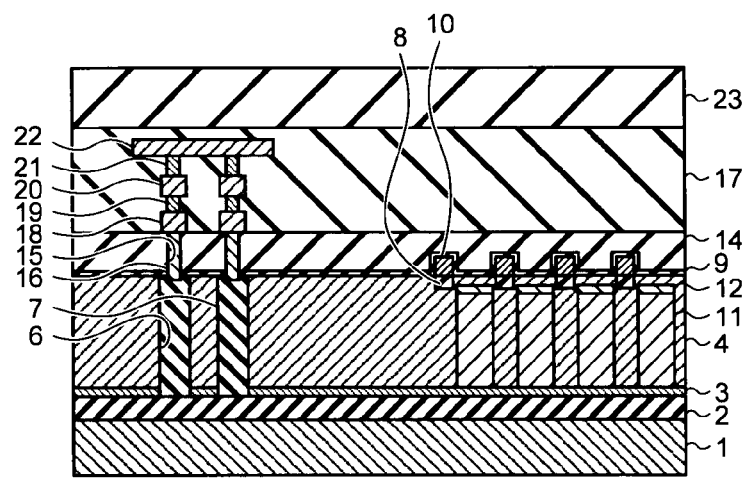

As illustrated in FIG. 3B, subsequently, a support substrate 23 is formed on the interlayer insulating layer 17. The support substrate 23 can be bonded to the interlayer insulating layer 17 through sticking. For a material of the support substrate 23, it is also possible to use a semiconductor substrate such as Si or an insulating substrate such as glass, ceramic or resin, for example.

Figure 3C:
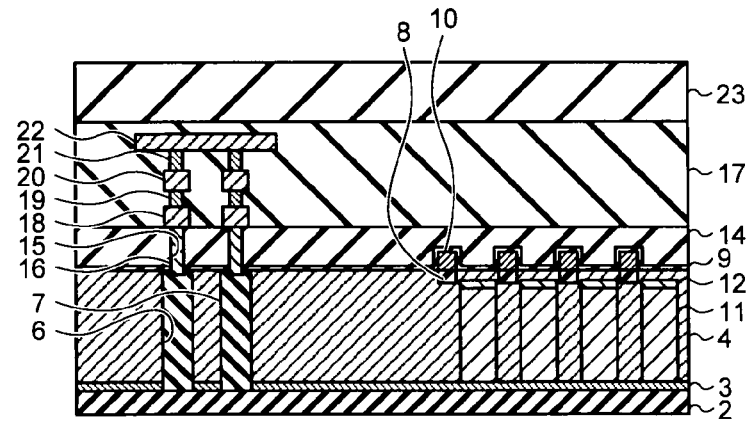

As illustrated in FIG. 3C, then, the semiconductor substrate 1 is thinned by etching or selective etching using hydrofluoric-nitric acid and is thus removed from the back face of the BOX layer 2. The BOX layer 2 can be used as a stop layer when the semiconductor substrate 1 is to be thinned.

Figure 3D:
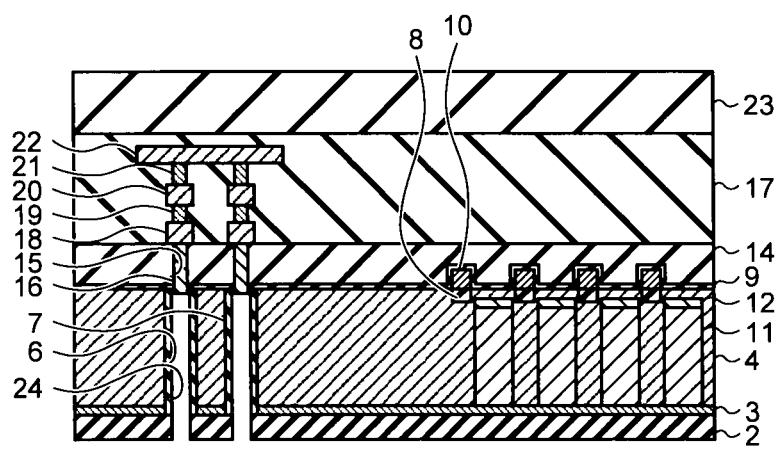

As illustrated in FIG. 3D, subsequently, an opening portion 24 for exposing the embedded electrode 16 is formed on the through hole insulating layer 7 by using photolithography and dry etching. At this time, the through hole insulating layer 7 can be left on a side surface of the through hole 6.

Figure 4A:
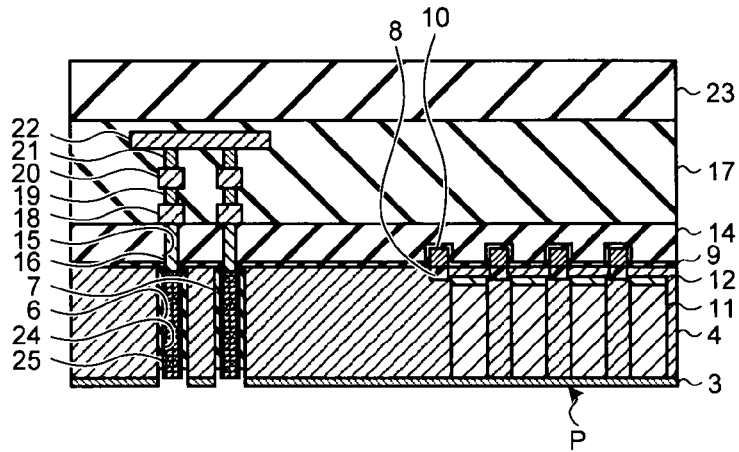
FIGS. 4A to 4D are sectional views illustrating each step in the method for manufacturing a semiconductor device according to the first embodiment.

As illustrated in FIG. 4A, then, a through electrode 25 is formed on the back face of the BOX layer 2 to fill in the opening portion 24 by a method such as plating or CVD. Thereafter, the through electrode 25 is thinned by a method such as CMP. Thus, the through electrode 25 provided on the back face of the BOX layer 2 is removed. For example, W, Al, Cu or the like can be used for a material of the through electrode 25. Subsequently, the BOX layer 2 is subjected to etching and is thus removed from the back face of the N-type semiconductor layer 4, and a light incidence plane P is provided on the back face of the N-type semiconductor layer 4.

Figure 4B:
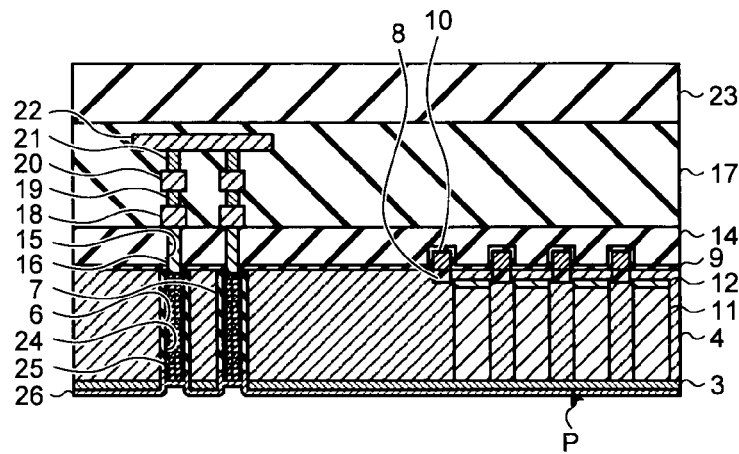

As illustrated in FIG. 4B, next, an amorphous Si layer 26 containing B having a high concentration is formed on the back face of the N-type semiconductor layer 4 at a film formation temperature of 350° C. to 400° C. by a method such as CVD. It is desirable that the concentration of B should be equal to or higher than $1.0 \times 10^{19}/cm^3$. Since a dangling bond of Si on an interface of this layer is terminated with amorphous Si or hydrogen, an interface state can be reduced. Furthermore, the layer can also act as a gettering layer for a metallic contamination, thereby reducing a leakage current of a photodiode. Although the amorphous Si containing B having a high concentration is used in the method described above, any substance capable of reducing an interface state and having an effect for gettering is not restricted even if the formation is carried out by undoping or a method containing another element such as As, In, Sb, Ga, Al or P. Even if the amorphous Si layer 26 containing no impurity is formed, moreover, the reduction in the interface state can be achieved.

The amorphous Si layer 26 formed in FIG. 4B is changed into polysilicon through an execution of a sintering step after a subsequent formation of a wiring and before a formation of an antireflection film which will be described below. The sintering step indicates annealing in an environment of a reducing gas and is executed at 400° C. for approximately one hour, for example. Consequently, the reduction in the interface state and a contact resistance and a recovery of damage are carried out. By executing gettering annealing at 400° C. to 450° C. for approximately 15 minutes to 5 hours, for example, after the formation of the amorphous Si layer 26 and before the formation of the antireflection film, it is possible to obtain the gettering effect. The gettering annealing may be executed together with the sintering step.

Figure 4C:
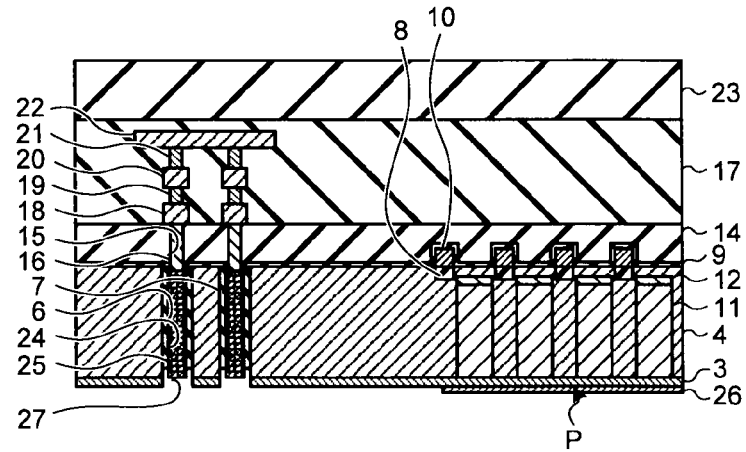

As illustrated in FIG. 4C, next, an opening portion 27 for exposing the through electrode 25 is formed, and furthermore, the amorphous Si layer 26 in a region other than a pixel region is removed by using the photolithography and the dry etching.

Figure 4D:
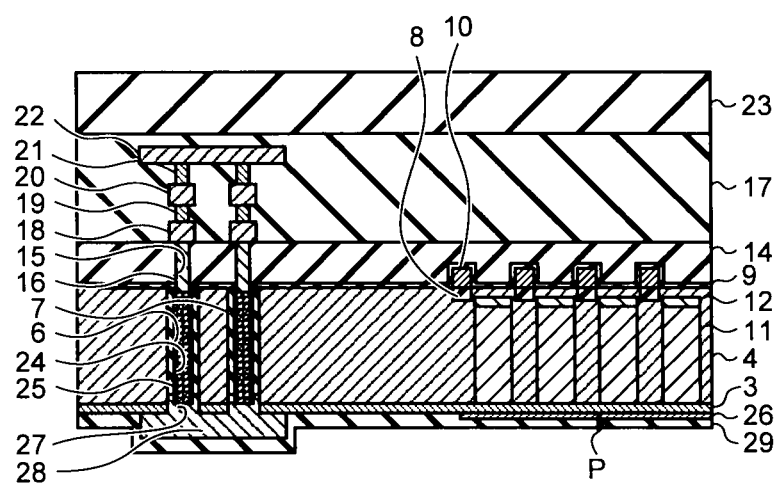

As illustrated in FIG. 4D, subsequently, a pad electrode 28 connected to the through electrode 25 via the opening portion 27 is formed. Then, an insulating layer 29 is formed on whole surfaces of the pad electrode 28 and the amorphous Si layer 26 by a method such as CVD. For example, a silicon oxide film can be used for a material of the insulating layer 29.

Figure 5A:
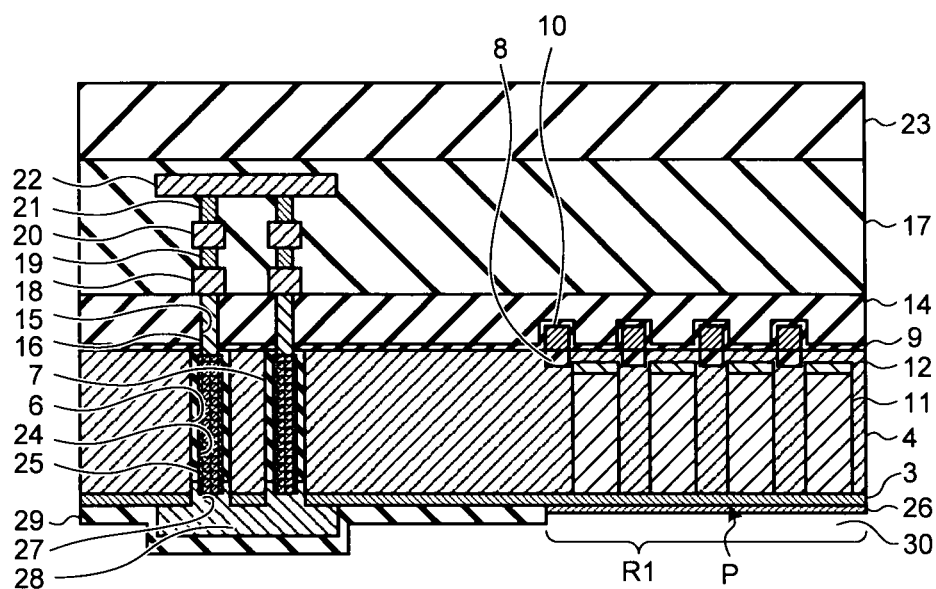
FIGS. 5A to 5C are sectional views illustrating each step in the method for manufacturing a semiconductor device according to the first embodiment.

As illustrated in FIG. 5A, thereafter, an opening portion 30 for exposing a pixel region R1 provided on the back face of the N-type semiconductor layer 4 is formed on the insulating layer 29 by using the photolithography and the dry etching.

Figure 5B:
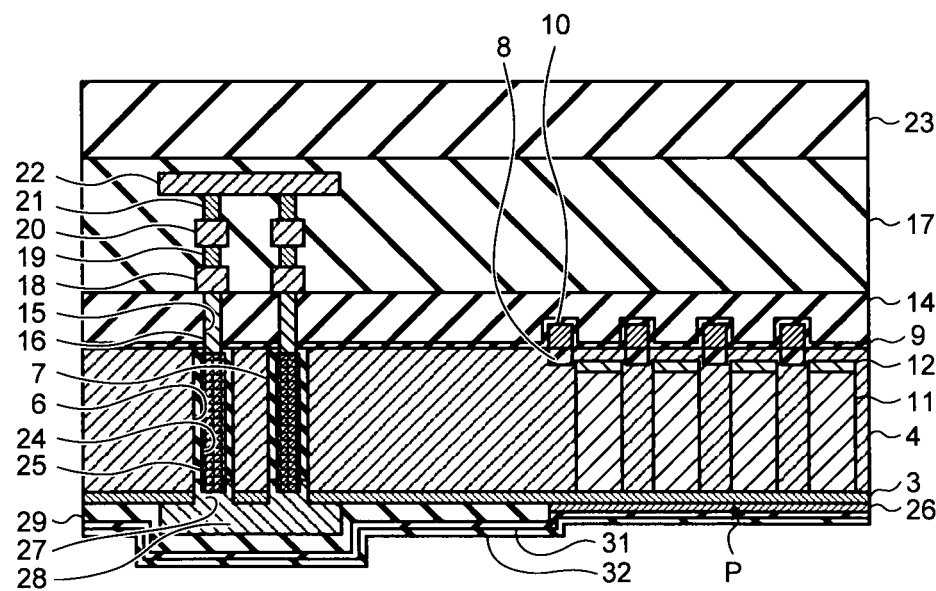

As illustrated in FIG. 5B, next, antireflection films 31 and 32 are formed on the back face side of the N-type semiconductor layer 4 in sequence by using a method such as CVD or sputtering. For example, a silicon oxide film can be used for materials of the antireflection films 31 and 32. At this time, refractive indices of the antireflection films 31 and 32 can be caused to be different from each other.

Figure 5C:
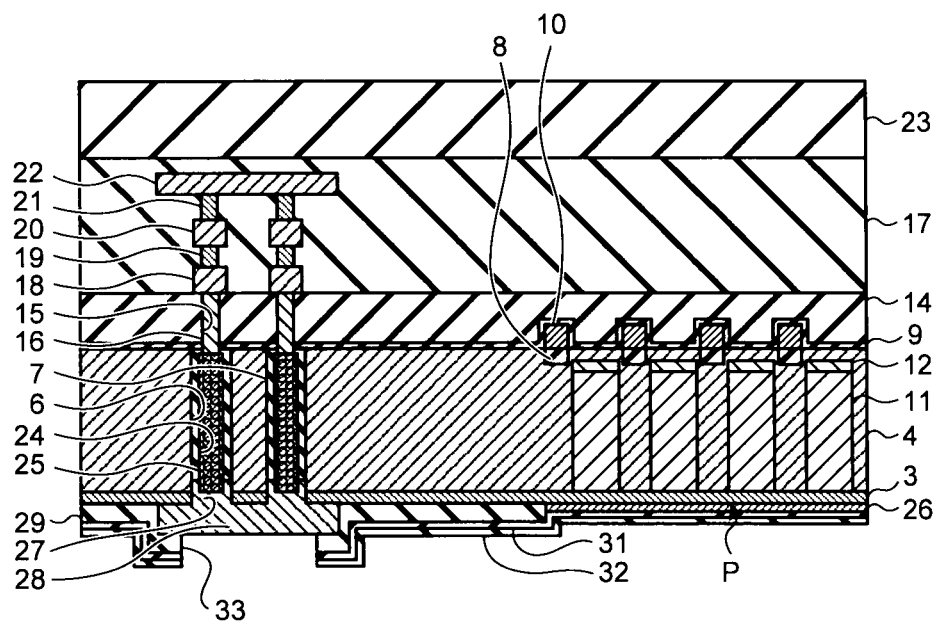

As illustrated in FIG. 5C, subsequently, an opening portion 33 for exposing the pad electrode 28 is formed on the antireflection films 31 and 32 by using the photolithography and the dry etching.

Figure 6:
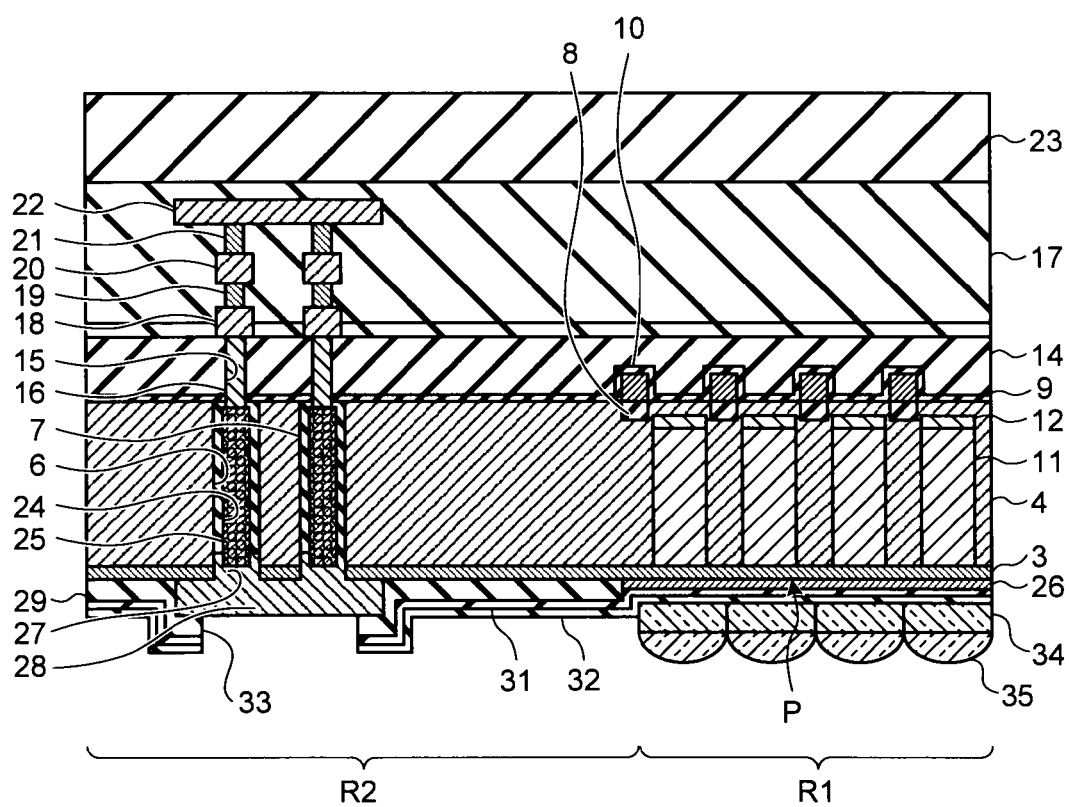
FIG. 6 is a sectional view illustrating each step in the method for manufacturing a semiconductor device according to the first embodiment.

As illustrated in FIG. 6, finally, a color filer 34 is formed on the antireflection film 32 for every pixel and an on-chip lens 35 is then formed on the color filter 34 for every pixel. For example, a transparent organic compound can be used for materials of the color filter 34 and the on-chip lens 35. At this time, the color filter 34 can be colored in red, green or blue, for example.

In order to suppress the interface state, generally, a method for forming a thermal oxide film can be proposed. In the manufacture of the backside-illumination type CMOS sensor, however, a metal wiring has already been formed and a metal is molten in a heat treatment at approximately 800° C. to 1100° C. in which the thermal oxide film is formed. For this reason, the thermal oxide film cannot be formed on a surface. As described above, however, it is possible to reduce an interface state and a leakage current of a photodiode by forming the amorphous Si layer containing B having a high concentration on the Si surface having a back face ground in the present embodiment. Consequently, it is possible to achieve an enhancement in a yield.

(Second Embodiment)

Although the description has been given to the method for forming the backside-illumination type CMOS image sensor by using the SOI substrate in the first embodiment, a backside-illumination type CMOS image sensor is formed by using a bulk epitaxial substrate in the present embodiment. A method for manufacturing a semiconductor device according to the present embodiment will be described with reference to FIGS. 7A to 12 to be sectional views illustrating each step.

Figure 7A:
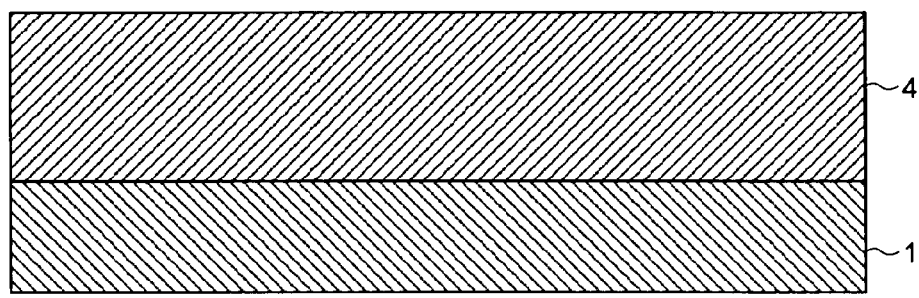
FIGS. 7A to 7D are sectional views illustrating each step in a method for manufacturing a semiconductor device according to a second embodiment.

In FIG. 7A, an N-type semiconductor layer 4 is epitaxially grown on a semiconductor substrate 1 to be a bulk epitaxial substrate. Although a P-type semiconductor layer may be epitaxially grown on the semiconductor substrate 1, description will be given to the case in which the N-type semiconductor layer 4 is formed as an example.

Figure 7B:
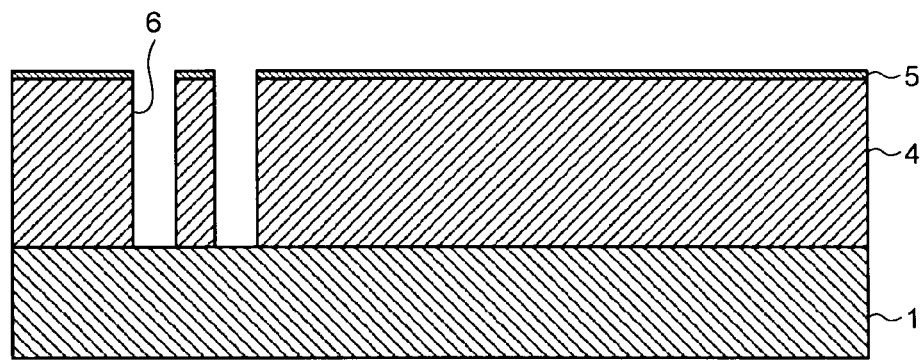

As illustrated in FIG. 7B, next, a stopper layer 5 is provided on a whole surface of the N-type semiconductor layer 4 by a method such as CVD. By using photolithography and dry etching, then, a through hole 6 is formed on the stopper layer 5 and the N-type semiconductor layer 4. For example, a silicon nitride film can be used for a material of the stopper layer 5.

Figure 7C:
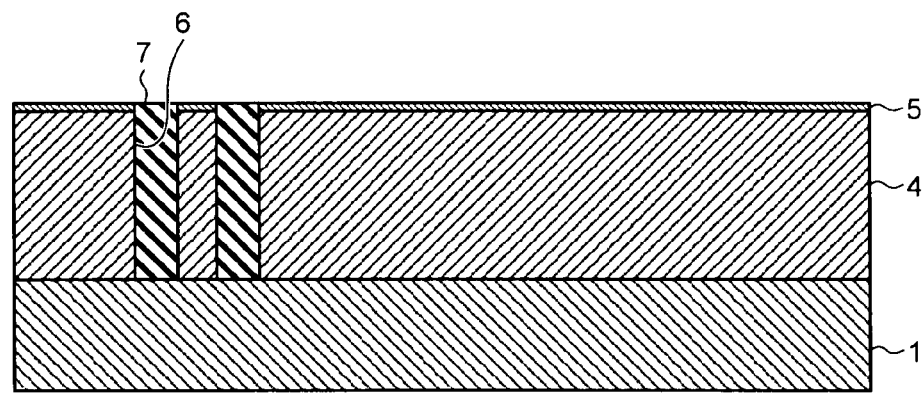

As illustrated in FIG. 7C, subsequently, a through hole insulating layer 7 is provided on a whole surface of the stopper layer 5 to fill in the through hole 6 by a method such as CVD. Then, the through hole insulating layer 7 is thinned by using a method such as CMP to remove the through hole insulating layer 7 provided on the stopper layer 5. A silicon oxide film can be used for a material of the through hole insulating layer 7.

Figure 7D:
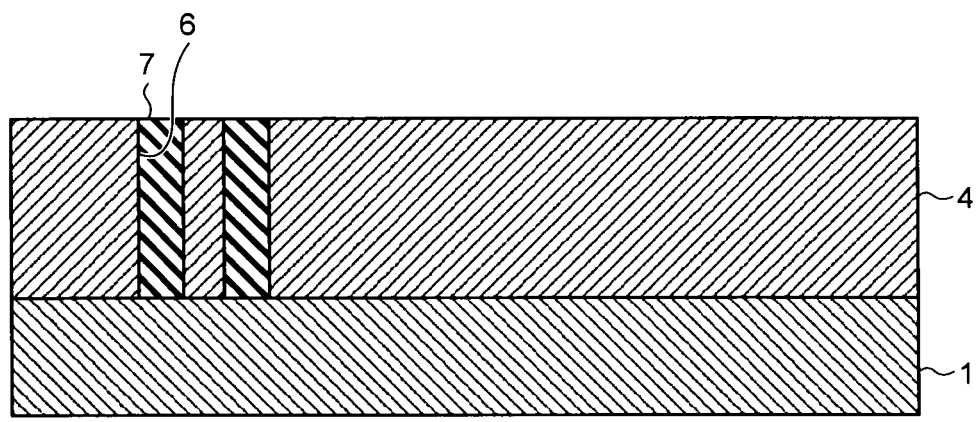

As illustrated in FIG. 7D, thereafter, the stopper layer 5 is subjected to etching so that the stopper layer 5 is removed from the N-type semiconductor layer 4. It is preferable that wet etching should be used to prevent the surface of the N-type semiconductor layer 4 from being damaged when removing the stopper layer 5 from the N-type semiconductor layer 4.

Figure 8A:
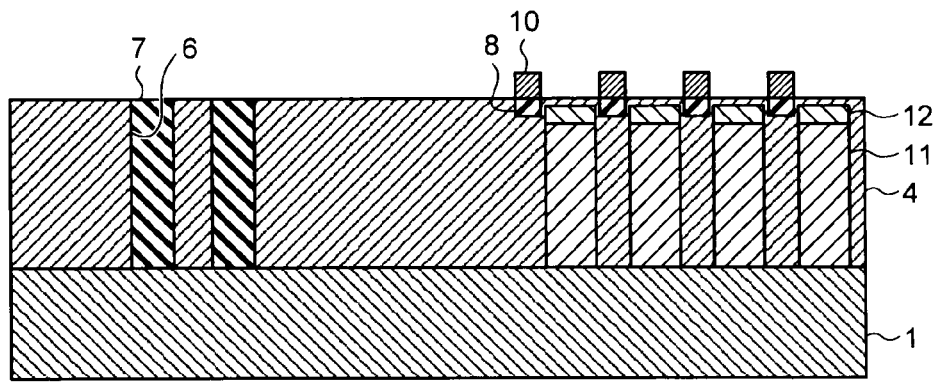
FIGS. 8A to 8D are sectional views illustrating each step in the method for manufacturing a semiconductor device according to the second embodiment.

As illustrated in FIG. 8A, next, an element isolating layer 8 disposed between pixels is embedded in the surface side of the N-type semiconductor layer 4 and a gate electrode 10 is then formed on the N-type semiconductor layer 4 for every pixel. For example, a silicon oxide film can be used for a material of the element isolating layer 8 and a polycrystalline silicon film can be used for a material of the gate electrode 10.

Thereafter, an impurity ion such as P or As is implanted into the N-type semiconductor layer 4 to form an N-type impurity introduced layer 11 in a deep position of the N-type semiconductor layer 4. Moreover, an impurity ion such as B is implanted into the N-type semiconductor layer 4 to form a P-type impurity introduced layer 12 in a shallow position of the N-type semiconductor layer 4. The P-type impurity introduced layer 12 is provided on the N-type impurity introduced layer 11 so that a photodiode is formed as a photoelectric converting portion for every pixel.

Before the gate electrode 10 is formed on the N-type semiconductor layer 4, the N-type impurity introduced layer 11 and the P-type impurity introduced layer 12 may be formed on the N-type semiconductor layer 4.

Figure 8B:
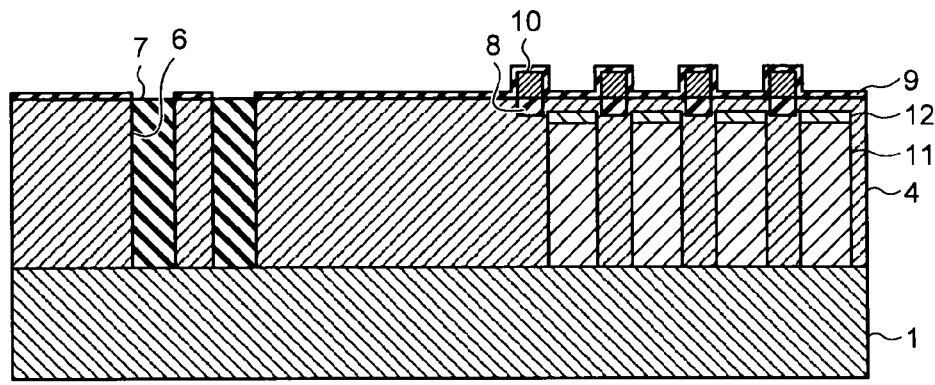

As illustrated in FIG. 8B, subsequently, an insulating film 9 is formed on the surface of the N-type semiconductor layer 4 by thermal oxidation or CVD. A thickness of the insulating film 9 can be set to be approximately 5 to 6 nm. An impurity to be used for an ion implantation at this time can be Si, Ge, C, B, In or the like, for example. By forming the silicon oxide film 9 before implanting the ion into the surface layers of the N-type semiconductor layer 4 and the N-type impurity introduced layer 11, moreover, it is possible to uniformly carry out the ion implantation.

Figure 8C:
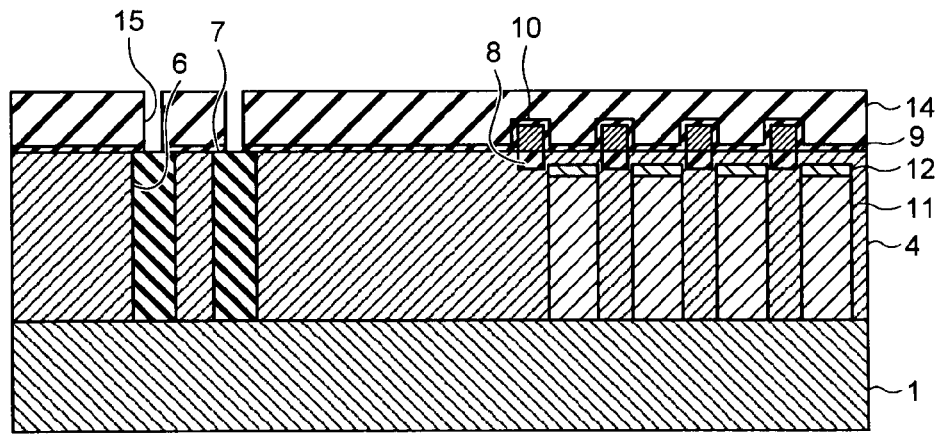

As illustrated in FIG. 8C, next, an interlayer insulating layer 14 is provided on a whole surface of the N-type semiconductor layer 4 by a method such as CVD. By using photolithography and dry etching, then, an opening portion 15 for exposing the through hole insulating layer 7 is formed on the insulating film 9 and the interlayer insulating layer 14. For example, a silicon oxide film can be used for a material of the interlayer insulating layer 14. In the case in which the insulating film 9 and the interlayer insulating layer 14 are formed by the same material, moreover, the insulating film 9 and the interlayer insulating layer 14 can be formed integrally.

Figure 8D:
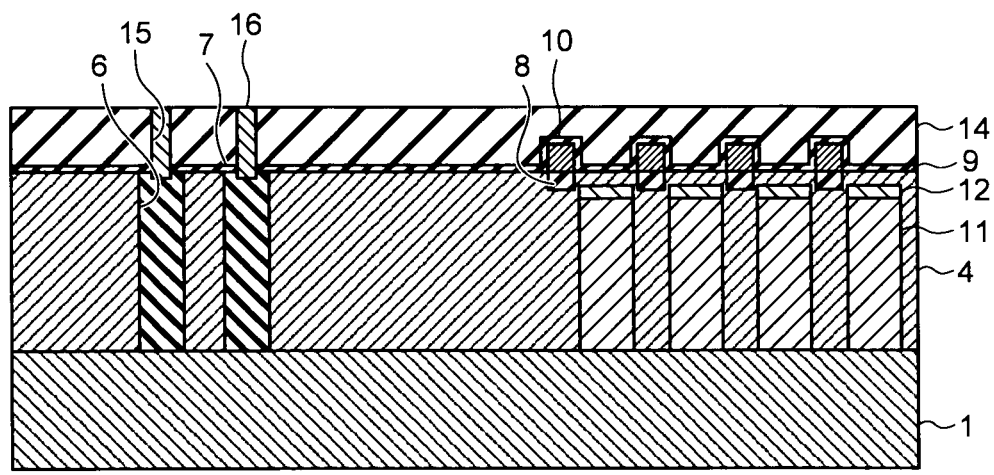

As illustrated in FIG. 8D, thereafter, an embedded electrode 16 is formed on the whole surface of the interlayer insulating layer 14 to fill in the opening portion 15 by a method such as CVD. Subsequently, the embedded electrode 16 is thinned through a method such as CMP and the embedded electrode 16 provided on the interlayer insulating layer 14 is thus removed. For example, it is possible to use W, Al, Cu or the like for a material of the embedded electrode 16.

Figure 9A:
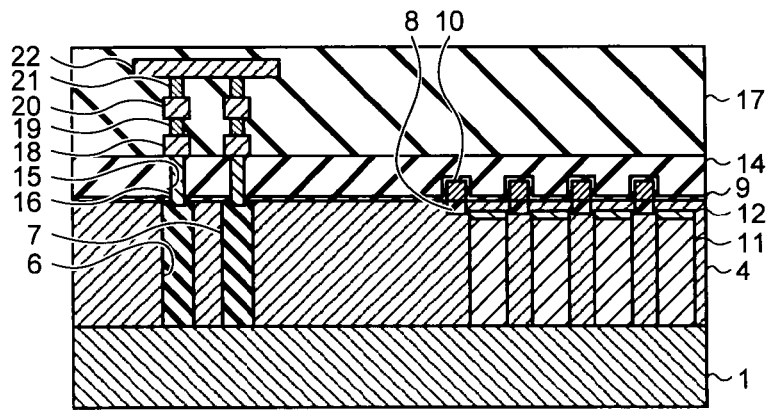
FIGS. 9A to 9D are sectional views illustrating each step in the method for manufacturing a semiconductor device according to the second embodiment.

As illustrated in FIG. 9A, next, an interlayer insulating layer 17 is provided on a whole surface of the interlayer insulating layer 14 by a method such as CVD, and wirings 18, 20 and 22 and embedded electrodes 19 and 21 which are embedded in the interlayer insulating layer 17 are formed. For example, a silicon oxide film can be used for a material of the interlayer insulating layer 14, Al or Cu can be used for materials of the wirings 18, 20 and 22, and W, Al, Cu or the like can be used for materials of the embedded electrodes 19 and 21.

Figure 9B:
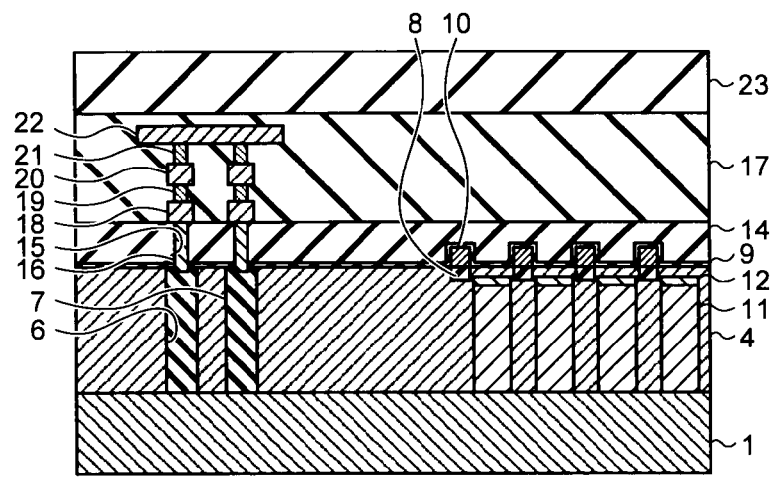

As illustrated in FIG. 9B, subsequently, a support substrate 23 is formed on the interlayer insulating layer 17. The support substrate 23 can be bonded to the interlayer insulating layer 17 through sticking. For a material of the support substrate 23, moreover, it is also possible to use a semiconductor substrate such as Si or an insulating substrate such as glass, ceramic or resin, for example.

Figure 9C:
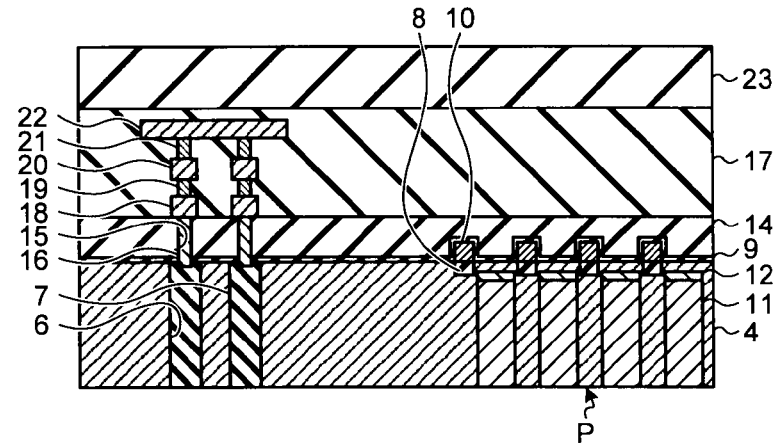

As illustrated in FIG. 9C, then, the semiconductor substrate 1 is thinned by etching or selective etching using hydrofluoric-nitric acid. Consequently, the semiconductor substrate 1 is removed. Since the stopper layer is not provided, the semiconductor substrate 1 is removed to have a desirable film thickness through a film thickness control. Thus, a light incidence plane P is provided on the back face of the N-type semiconductor layer 4.

Figure 9D:
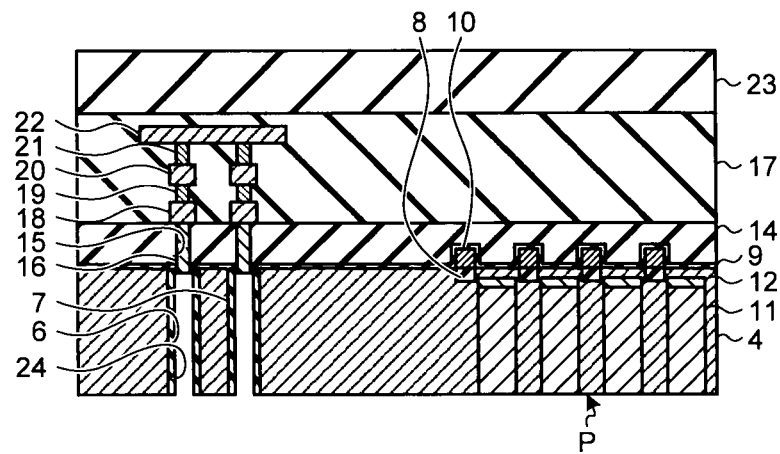

As illustrated in FIG. 9D, subsequently, an opening portion 24 for exposing the embedded electrode 16 is formed on the through hole insulating layer 7 by using photolithography and dry etching. At this time, the through hole insulating layer 7 can be left on a side surface of the through hole 6.

Figure 10A:
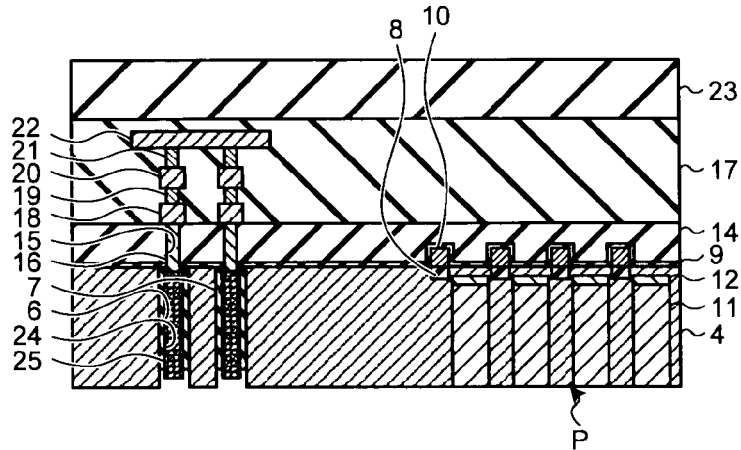
FIGS. 10A to 10D are sectional views illustrating each step in the method for manufacturing a semiconductor device according to the second embodiment.

As illustrated in FIG. 10A, then, a through electrode 25 is formed on the back face to fill in the opening portion 24 by a method such as plating or CVD. For example, W, Al, Cu or the like can be used for a material of the through electrode 25.

Figure 10B:
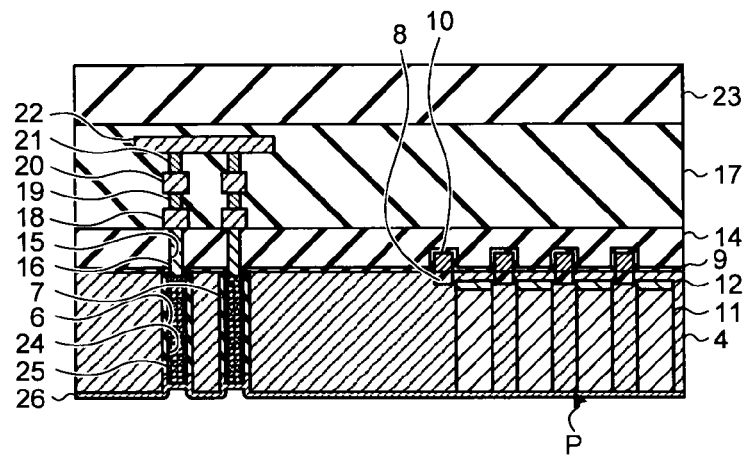

As illustrated in FIG. 10B, thereafter, an amorphous Si layer 26 containing B having a high concentration is formed on the back face of the N-type semiconductor layer 4 at a film formation temperature of 350° C. to 400° C. by a method such as CVD. It is desirable that the concentration of B should be equal to or higher than $1.0 \times 10^{19}/cm^3$. Since a dangling bond of Si on an interface of this layer is terminated with amorphous Si or hydrogen, an interface state can be reduced. Furthermore, the layer can also act as a gettering layer for a metallic contamination and can reduce a leakage current of a photodiode. Although the amorphous Si containing B having a high concentration is used in the method described above, any substance capable of reducing an interface state and having an effect for gettering is not restricted even if the formation is carried out by undoping or a method containing another element such as As, In, Sb, Ga, Al or P. Even if an amorphous Si layer 26 containing no impurity is formed, moreover, the reduction in the interface state can be achieved.

The amorphous Si layer 26 formed in FIG. 10B is changed into polysilicon through an execution of a sintering step after a subsequent formation of a wiring and before a formation of an antireflection film which will be described below. The sintering step indicates annealing in an environment of a reducing gas and is executed at 400° C. for approximately one hour, for example. Consequently, the reduction in the interface state and a contact resistance and a recovery of damage are carried out. By executing gettering annealing at 400° C. to 450° C. for approximately 15 minutes to 5 hours, for example, after the formation of the amorphous Si layer 26 and before the formation of the antireflection film, it is possible to obtain the gettering effect. The gettering annealing may be executed together with the sintering step.

Figure 10C:
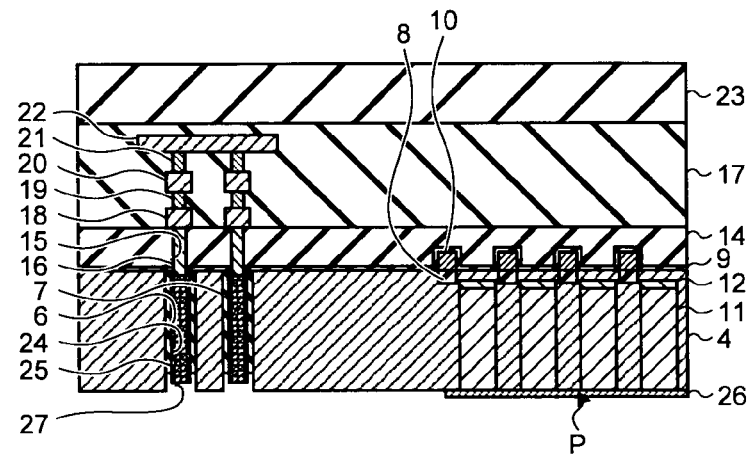

As illustrated in FIG. 10C, next, an opening portion 27 for exposing the through electrode 25 is formed, and furthermore, the amorphous Si layer 26 in a region other than a pixel region is removed by using the photolithography and the dry etching.

Figure 10D:
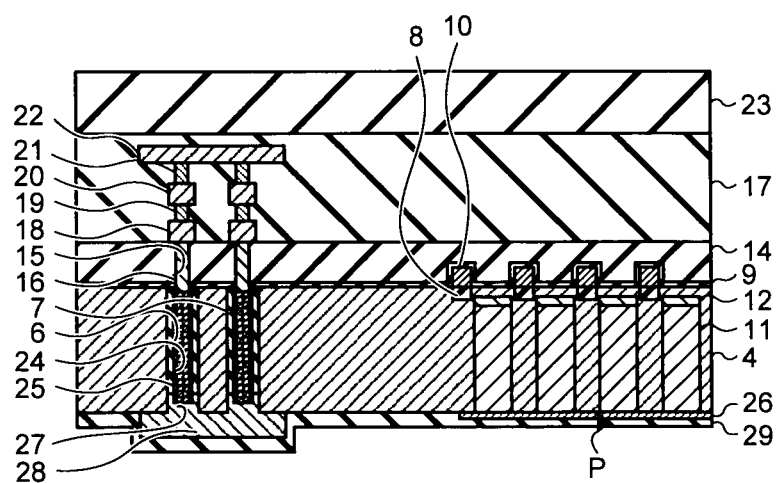

As illustrated in FIG. 10D, subsequently, a pad electrode 28 connected to the through electrode 25 via the opening portion 27 is formed. Then, an insulating layer 29 is formed on whole surfaces of the pad electrode 28 and the amorphous Si layer 26 by a method such as CVD. For example, a silicon oxide film can be used for a material of the insulating layer 29.

Figure 11A:
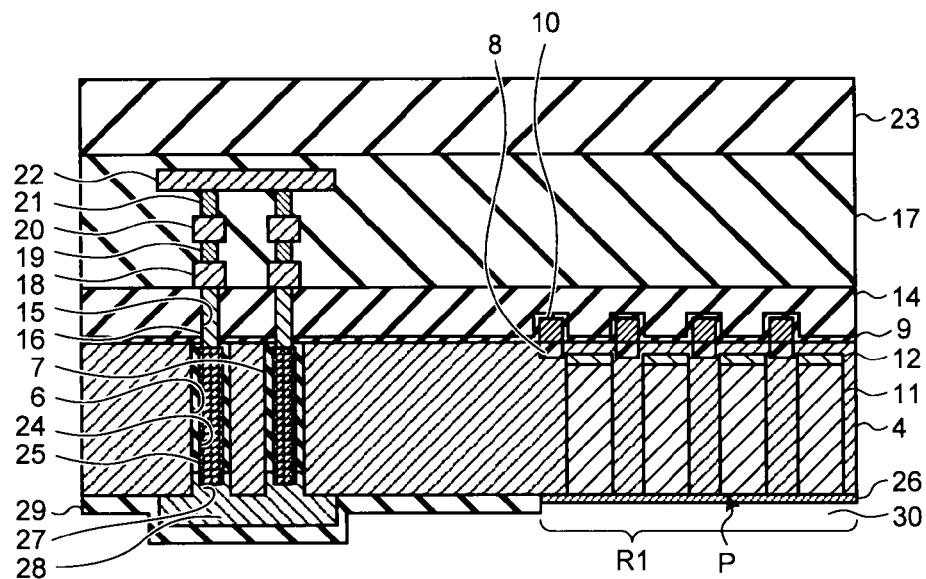
FIGS. 11A to 11C are sectional views illustrating each step in the method for manufacturing a semiconductor device according to the second embodiment.

As illustrated in FIG. 11A, thereafter, an opening portion 30 for exposing a pixel region R1 provided on the back face of the N-type semiconductor layer 4 is formed on the insulating layer 29 by using the photolithography and the dry etching.

Figure 11B:
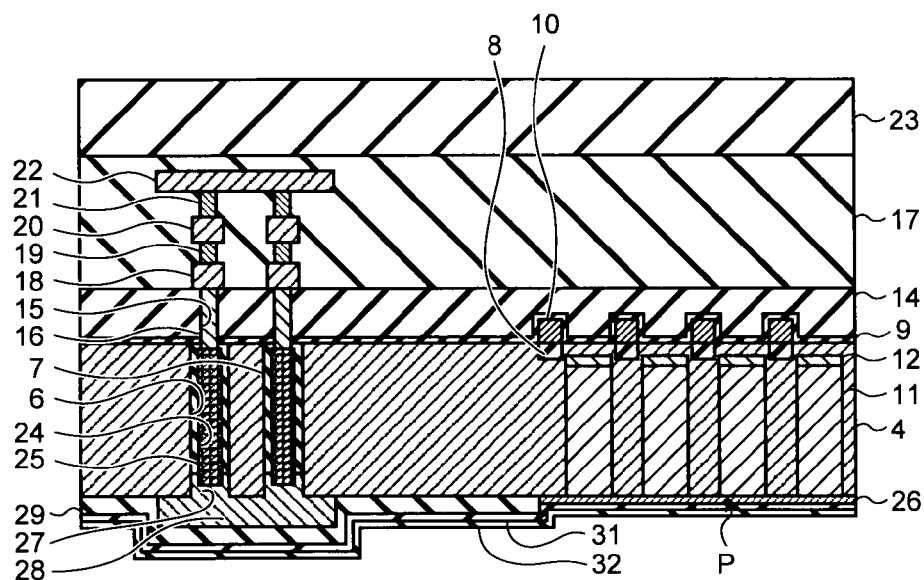

As illustrated in FIG. 11B, next, antireflection films 31 and 32 are formed on the back face side of the N-type semiconductor layer 4 in sequence by using a method such as CVD or sputtering. For example, a silicon oxide film can be used for materials of the antireflection films 31 and 32. At this time, refractive indices of the antireflection films 31 and 32 can be caused to be different from each other.

Figure 11C:
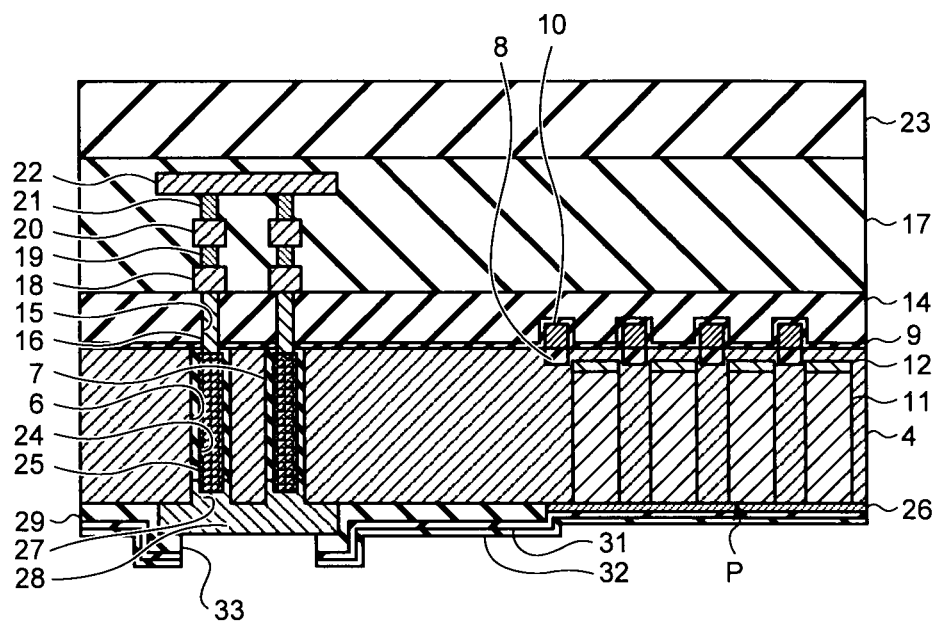

As illustrated in FIG. 11C, subsequently, an opening portion 33 for exposing the pad electrode 28 is formed on the antireflection films 31 and 32 by using the photolithography and the dry etching.

Figure 12:
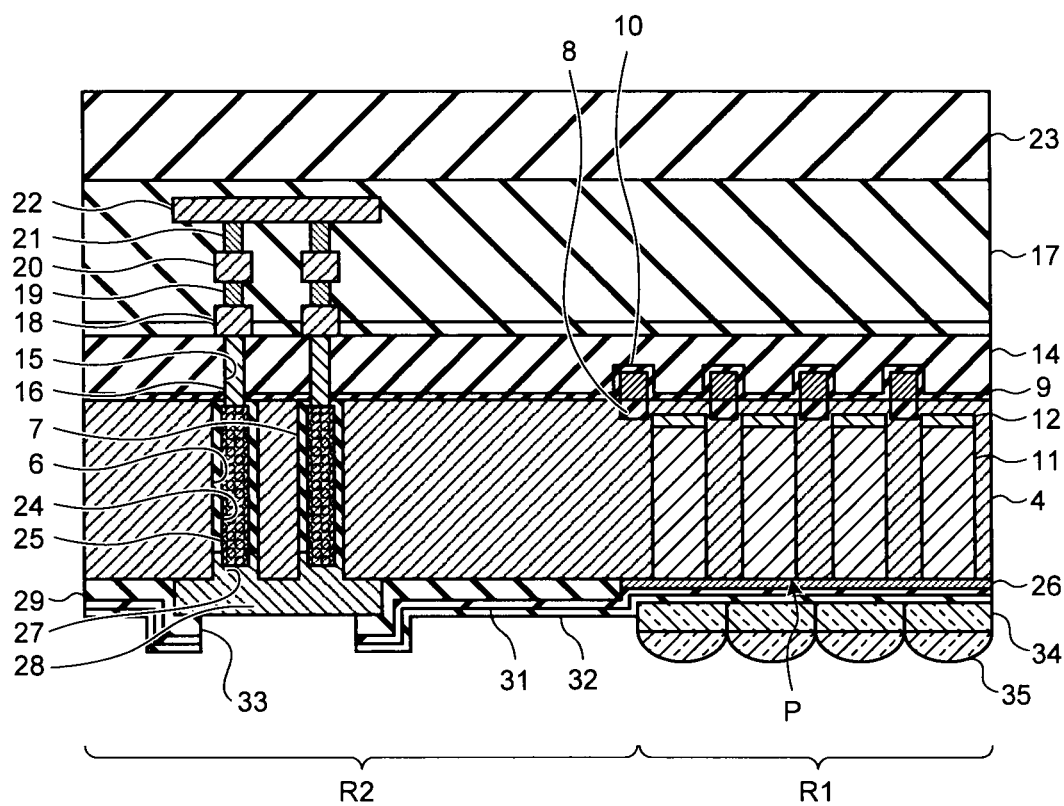
FIG. 12 is a sectional view illustrating each step in the method for manufacturing a semiconductor device according to the second embodiment.

As illustrated in FIG. 12, finally, a color filer 34 is formed on the antireflection film 32 for every pixel and an on-chip lens 35 is then formed on the color filter 34 for every pixel. For example, a transparent organic compound can be used for materials of the color filter 34 and the on-chip lens 35. At this time, the color filter 34 can be colored in red, green or blue, for example.

As described above, in the present embodiment, an insulating film having an unstable electric charge is not formed but the amorphous Si layer containing B having a high concentration or the like is formed on the Si surface having the back face ground in the method for manufacturing a backside-illumination type CMOS image sensor.

Consequently, it is possible to reduce the interface state of the Si surface and to obtain the gettering effect of a metal impurity. Therefore, it is possible to reduce a leakage current (a dark current) of a photodiode, particularly, a leakage current at a high temperature. Accordingly, it is possible to achieve an enhancement in a manufacturing yield.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
    epitaxially growing an epitaxial semiconductor layer on a semiconductor substrate;
    forming a photoelectric converting portion on the epitaxial semiconductor layer;
    forming a wiring layer on the epitaxial semiconductor layer after forming the photoelectric converting portion;
    bonding a support substrate onto the wiring layer;
    etching the semiconductor substrate from an opposite surface side to a side for the bonding after the bonding;
    forming an amorphous Si layer on the opposite surface side of the epitaxial semiconductor layer after the etching; and
    forming an antireflection film and a color filter on the amorphous Si layer in sequence,
    wherein sintering is carried out after forming the amorphous Si layer and before forming the antireflection film.
2. The method for manufacturing a semiconductor device according to claim 1, wherein the semiconductor substrate is an SOI substrate.

3. The method for manufacturing a semiconductor device according to claim 1, wherein gettering annealing is carried out after forming the amorphous Si layer and before forming the antireflection film.

4. The method for manufacturing a semiconductor device according to claim 1, wherein the epitaxial semiconductor layer has a conductivity type of N or P.

5. The method for manufacturing a semiconductor device according to claim 1, wherein the amorphous Si layer is formed at a film formation temperature of 350° C. to 400° C. by CVD.

6. The method for manufacturing a semiconductor device according to claim 1, wherein the amorphous Si layer is changed into polysilicon through the sintering.

7. The method for manufacturing a semiconductor device according to claim 3, wherein the gettering annealing is carried out together with the sintering.

8. The method for manufacturing a semiconductor device according to claim 1, wherein an on-chip lens is formed on the color filter.

9. A method for manufacturing a semiconductor device, comprising:
    epitaxially growing an epitaxial semiconductor layer on a semiconductor substrate;
    forming a photoelectric converting portion on the epitaxial semiconductor layer;
    forming a wiring layer on the epitaxial semiconductor layer after forming the photoelectric converting portion;
    bonding a support substrate onto the wiring layer;
    etching the semiconductor substrate from an opposite surface side to a side for the bonding after the bonding;
    forming an amorphous Si layer on the opposite surface side of the epitaxial semiconductor layer after the etching; and
    forming an antireflection film and a color filter on the amorphous Si layer in sequence,
    wherein gettering annealing is carried out after forming the amorphous Si layer and before forming the antireflection film.

10. The method for manufacturing a semiconductor device according to claim 9, wherein the semiconductor substrate is an SOI substrate.

11. The method for manufacturing a semiconductor device according to claim 9, wherein the epitaxial semiconductor layer has a conductivity type of N or P.

12. The method for manufacturing a semiconductor device according to claim 9, wherein the amorphous Si layer is formed at a film formation temperature of 350° C. to 400° C. by CVD.

13. The method for manufacturing a semiconductor device according to claim 9, wherein an on-chip lens is formed on the color filter.

* * * * *